(12) United States Patent
Huang et al.

(10) Patent No.: US 10,527,667 B2
(45) Date of Patent: Jan. 7, 2020

(54) DETECTION METHOD AND DETECTION DEVICE OF PROCESS CORNER OF MOS TRANSISTOR

(71) Applicants: Semiconductor Manufacturing International (Shanghai) Corporation, Shanghai (CN); Semiconductor Manufacturing International (Beijing) Corporation, Beijing (CN)

(72) Inventors: Cheng-Tai Huang, Shanghai (CN); Chia Chi Yang, Shanghai (CN); Chen-Yi Huang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 114 days.

(21) Appl. No.: 15/899,567

(22) Filed: Feb. 20, 2018

(65) Prior Publication Data

US 2018/0246160 A1   Aug. 30, 2018

(30) Foreign Application Priority Data

Feb. 24, 2017   (CN) .......................... 2017 1 0106247

(51) Int. Cl.
*G01R 31/26* (2014.01)
*H03K 3/03* (2006.01)
*H01L 21/66* (2006.01)
*G01R 31/28* (2006.01)

(52) U.S. Cl.
CPC ..... *G01R 31/2607* (2013.01); *G01R 31/2884* (2013.01); *H01L 22/34* (2013.01); *H03K 3/0315* (2013.01)

(58) Field of Classification Search
None
See application file for complete search history.

(56) References Cited

U.S. PATENT DOCUMENTS

2017/0219649 A1*   8/2017   Shan .................. G01R 31/2882

* cited by examiner

*Primary Examiner* — Douglas X Rodriguez
(74) *Attorney, Agent, or Firm* — Anova Law Group, PLLC (57) ABSTRACT

Method and device for detecting the process corner of a transistor are provided. The process corner detection method includes providing a ring oscillator. The ring oscillator includes an odd number of oscillation units connected in series and an output port of one of the oscillation units serves as the output port of the ring oscillator to output an oscillation signal. Each oscillation unit is constructed based on a PMOS transistor and an NMOS transistor. The process corner detection method further includes measuring the period of the oscillation signal and the maintaining time of the oscillation signal at a high level and a low level in each cycle; and determining the process corner of the PMOS transistor and the NMOS transistor in the oscillation unit based on the period of the oscillation signal and the maintaining time of the oscillation signal at a high level and a low level in each cycle.

19 Claims, 4 Drawing Sheets

Providing a ring oscillator. The ring oscillator includes an odd number of oscillation units connected in series and an output port of one of the oscillation units serves as the output port of the ring oscillator to output an oscillation signal. Each oscillation unit is constructed based on a PMOS transistor and an NMOS transistor. — S101

Measuring the period of the oscillation signal and the maintaining time of the oscillation signal at a high level and a low level in each cycle. — S102

Determining the process corner of the PMOS transistor and the NMOS transistor in the oscillation unit based on the period of the oscillation signal and the maintaining time of the oscillation signal at a high level and a low level in each cycle. — S103

DETECTION METHOD AND DETECTION DEVICE OF PROCESS CORNER OF MOS TRANSISTOR

CROSS-REFERENCES TO RELATED APPLICATIONS

This application claims the priority of Chinese patent application No. 201710106247.5, filed on Feb. 24, 2017, the entirety of which is incorporated herein by reference.

FIELD OF THE DISCLOSURE

The present disclosure generally relates to the field of electric circuit design and, more particularly, relates to a method and device for detecting the process corner of a metal oxide semiconductor field effect transistor.

BACKGROUND

Metal oxide semiconductor field effect (MOSFET) transistors or MOS transistors may have parameters greatly varied between different wafers and different batches of wafers. To reduce difficulties in designing a circuit and to allow a desired performance of the device, manufacturing processes need to be strictly controlled to thus control the process parameters to vary within a certain range. In the meantime, the wafers that are out of the performance range are scrapped to ensure the rest of the devices can satisfy the performance requirements.

Conventionally, a process sensor is used to detect the process corner of a MOS transistor in order to detect the effect of a current process on the circuit and to adjust the circuit in real time according to the process corner of the MOS transistor. The process sensor may be made based on a ring oscillator (RO), and the MOS transistor is used as an oscillation unit of the RO. The process corner of the MOS transistor is determined by detecting the oscillation signal of the RO output. In particular, each of the oscillation unit may include a PMOS transistor and an NMOS transistor, forming an inverter structure.

Figure 1:
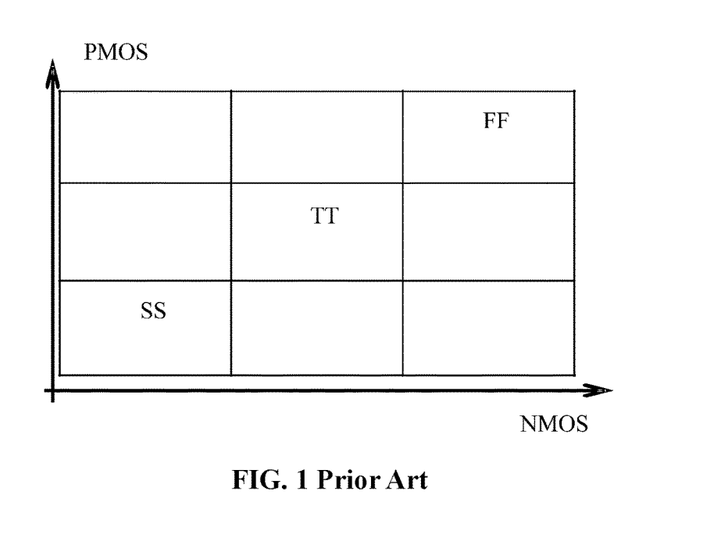
FIG. 1 illustrates a schematic view of detection range of a process corner for a MOS transistor.

As shown in FIG. 1, the process sensor often detects three process corners of a MOS transistor, fast, slow and standard, to evaluate the overall performance of the MOS transistor. Specifically, the overall performances of the PMOS transistor and the NMOS transistor in each of the oscillation units are detected, and the detection result may include fast NMOS fast PMOS (corresponding to "FF" in FIG. 1), slow NMOS slow PMOS (corresponding to "SS" in FIG. 1), and typical NMOS typical PMOS (corresponding to "TT" in FIG. 1), which is sufficient for digital integrated circuits. However, for analog integrated circuits, the process corner detection results provided by this process sensor are non-sufficient, and the analog integrated circuits need to evaluate the performance of each of the internal NMOS transistors and PMOS transistors.

BRIEF SUMMARY OF THE DISCLOSURE

One aspect of the present disclosure includes a process corner detection method of a MOS transistor. The process corner detection method includes providing a ring oscillator, and the ring oscillator includes an odd number of oscillation units connected in series. An output port of one of the oscillation units is taken as the output port of the ring oscillator and outputs an oscillation signal. Each oscillation unit is constructed based on a PMOS transistor and an NMOS transistor. The process corner detection method further includes measuring the period of the oscillation signal and the maintaining time of the oscillation signal at a high level and a low level in each cycle; and determining the process corner of the PMOS transistor and the NMOS transistor in an oscillation unit based on the period of the oscillation signal and the maintaining time of the oscillation signal at the high level and the low level in each cycle.

Another aspect of the present disclosure includes a device of detecting a process corner of a MOS transistor. The detection device includes a ring oscillator, and the ring oscillator includes an odd number of oscillation units connected in series. The output port of one of the oscillation units serves as an output port of the ring oscillator to output an oscillation signal, and each oscillation unit is constructed based on a PMOS transistor and an NMOS transistor. The period and maintaining time of the oscillation signal are measured at a high level and a low level in each cycle; and the process corner of the PMOS transistor and the NMOS transistor in the oscillation unit is determined based on the period of the oscillation signal and the maintaining time of the oscillation signal at the high level and the low level in each cycle.

Other aspects of the present disclosure can be understood by those skilled in the art in light of the description, the claims, and the drawings of the present disclosure.

DETAILED DESCRIPTION

Reference will now be made in detail to the exemplary embodiments of the disclosure, which are illustrated in the accompanying drawings. Wherever possible, the same reference numbers will be used throughout the drawings to refer to the same or similar parts.

Process sensors are often used to detect three process corners, including fast, slow, and typical process corners, and evaluate the overall performance of the MOS transistor. The evaluation results are sufficient for digital integrated circuits, but not for analog integrated circuits. In the analog integrated circuits, the performance of each of the internal NMOS transistor and PMOS transistor needs to be evaluated separately.

Figure 2:
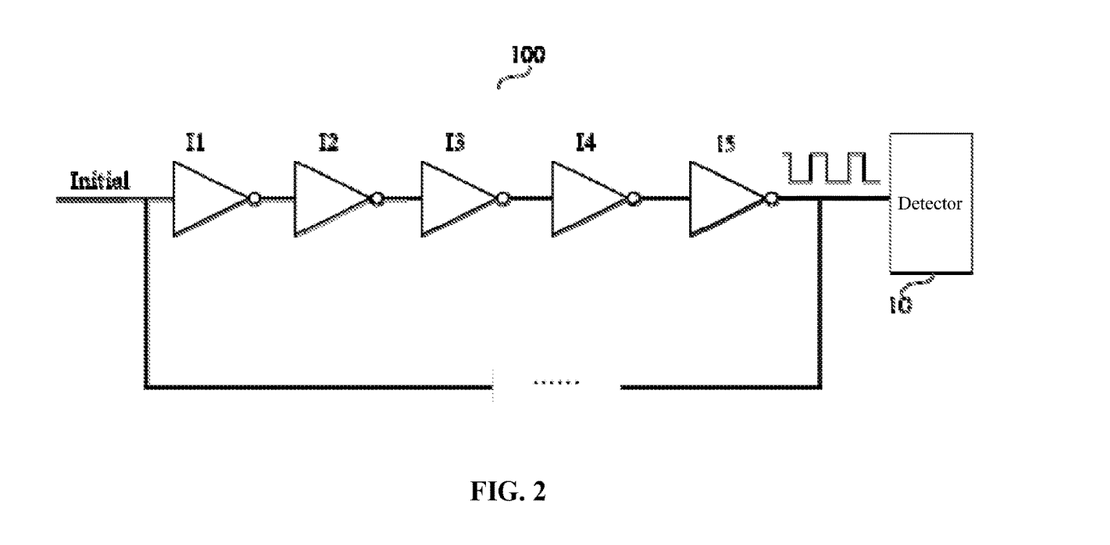
FIG. 2 illustrates a schematic structural view of a detection circuit of a process corner of a MOS transistor.

As shown in FIG. 2, a process corner detection circuit 100 may include a ring oscillator and a detector 10. The ring oscillator (RO) may include an odd number of oscillation units, and the oscillation unit may be an inverter. Each inverter includes an NMOS transistor and a PMOS transistor. For illustrative purposes, FIG. 2 only shows a ring oscillator including five inverters I1, I2, I3, I4 and I5 as an example, and for simplicity, the internal structure of the inverter is not shown. The detector 10 is connected to the output port of the ring oscillator. FIG. 2 shows an example of using the output port of the inverter I5 as the output port of the ring oscillator. The initial signal applied on the input port of a certain oscillation unit (inverter I1 in FIG. 2) of the ring oscillator is used to initiate the ring oscillator.

In the process corner detection circuit 100, the detector 10 detects a period of the output signal at the output port of the ring oscillator, and the period of the output signal is equal to the device delay of a single oscillation unit (e.g., an inverter) multiplied by the number of oscillation units included in the ring oscillator, and then multiplied by 2. Thus, when the number of oscillation units included in the ring oscillator is fixed, the magnitude of the period of an output signal depends on the device delay of a single oscillation unit, and the device delay of a single oscillation unit further depends on the conduction velocity of the NMOS transistor and the PMOS transistor. In a specific embodiment, the period of the output signal may be compared with the range of the threshold value. If the period of the output signal is greater than the upper limit of the threshold value, the MOS transistor is at the slow NMOS slow PMOS process corner, which means the NMOS transistor has a relatively thick gate oxide layer and a relatively high threshold voltage. If the period of the output signal is less than the lower limit of the threshold value, the MOS transistor is at the fast NMOS fast PMOS process corner, which means the MOS transistor has a relatively thin gate oxide layer and a relatively low threshold voltage. If the period of the output signal falls within the range of the threshold value, the MOS transistor is at the typical NMOS typical PMOS process corner, which means the gate oxide layer and the threshold voltage of the MOS transistor are both moderate.

Most of the digital integrated circuits are gate circuits. For example, an inverter including an NMOS transistor and a PMOS transistor is a basic device for the digital integrated circuit. The performance range of a MOS transistor provided by the process corner detection result obtained by the process corner detection circuit 100 is sufficient for a digital integrated circuit. However, for an analog integrated circuit, it is necessary to provide the performance range of an NMOS transistor and the performance range of a PMOS transistor respectively, and therefore the process corner detection result provided by the process corner detection circuit 100 is not appropriate for an analog integrated circuit. Therefore, the process corner detection method of a MOS transistor based on current technologies needs to be improved.

An exemplary process corner detection method may be based on a ring oscillator. According to the period of the oscillation signal output from the ring oscillator and the maintaining time of the oscillation signal at a high level and a low level in each cycle, the process corner of the PMOS transistor and the NMOS transistor in the oscillation unit can be determined to be one of the following nine process corners: fast NMOS fast PMOS, typical NMOS fast PMOS, fast NMOS typical PMOS, slow NMOS slow PMOS, slow NMOS typical PMOS, typical NMOS slow PMOS, typical NMOS typical PMOS, slow NMOS fast PMOS, and fast NMOS slow PMOS. Therefore, a complete detection of the process corner of a MOS transistor is realized.

As disclosed herein, the "fast", "typical", and "slow" modes are only relative terms, and the specific range of these three modes can be adjusted adaptively without limitations. More specifically, "fast" means that the response of a MOS transistor is relatively fast, "slow" means that the response of a MOS transistor is relatively slow, and the "typical" mode is in a range between the "fast" and "slow" modes. For example, the "typical" response speed can be a response speed under the preset typical conditions.

Figure 3:
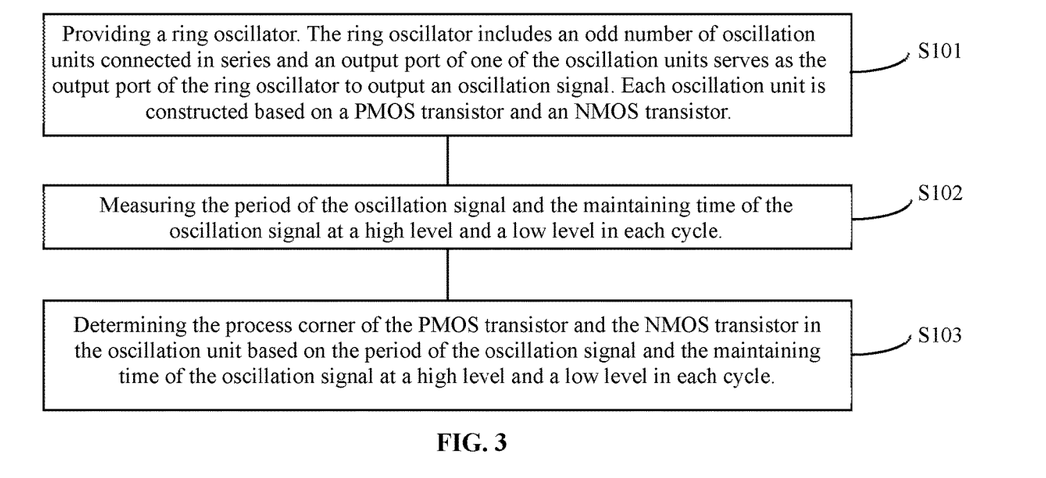
FIG. 3 is a flowchart of an exemplary detection method of a process corner of a MOS transistor consistent with various disclosed embodiments of the present disclosure.

FIG. 3 is a flowchart of an exemplary process corner detection method for a MOS transistor consistent with various disclosed embodiments.

In S101, a ring oscillator is provided having an odd number of oscillation units connected in series. The output port of one of the oscillation units serves as the output port of the ring oscillator to output an oscillation signal. Each oscillation unit is constructed based on a PMOS transistor and an NMOS transistor.

In S102, the period of the oscillation signal and the maintaining time of the oscillation signal at a high level and a low level in each cycle are measured.

In S103, the process corner of the PMOS and NMOS transistors in the oscillation unit is determined according to the period of the oscillation signal and the maintaining time of the oscillation signal at a high level and a low level in each cycle.

In various embodiments, the conduction velocity of the NMOS and PMOS transistors can be respectively detected to obtain the process corner of the NMOS and the PMOS transistors (for example, the NMOS and PMOS transistors on the wafer to be detected). Further, different process deviations, such as doping concentration, manufacturing temperature, degree of etching, etc., will have different degrees of influence on different regions of the same wafer, resulting in formation of different process corners on the wafer. At different process corners, the NMOS and PMOS transistors can exhibit different conduction rates, different thicknesses of the gate oxide, different threshold voltages, and different magnitudes of the transistor drive current. The transistor drive current refers to the source/drain current of the MOS transistor, indicating speed of carrier mobility of the MOS transistor. The carrier mobility is the drift velocity of the carriers under a unit electric field. As disclosed herein, the process corners are determined by detecting the conduction velocity of respective NMOS and PMOS transistors.

Figure 4:
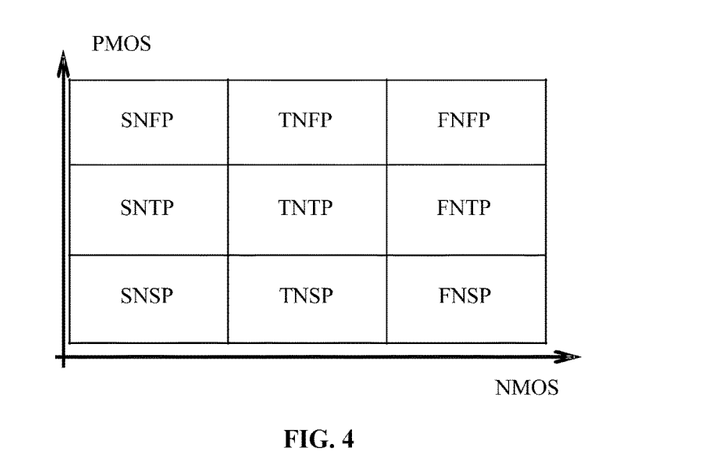
FIG. 4 illustrates a schematic view of a detection range of the process corner detection method of the MOS transistor in FIG. 3 consistent with various disclosed embodiments of the present disclosure.

Referring back to S103 in FIG. 3, the process to determine the process corner of the PMOS and NMOS transistors in an oscillation unit may include: determining the process corner of the PMOS transistor and the NMOS transistor in an oscillation unit to be one of the following nine exemplary process corners: fast NMOS fast PMOS (the "FNFP" in FIG. 4), typical NMOS fast PMOS (the "TNFP" in FIG. 4), fast NMOS typical PMOS (the "FNTP" in FIG. 4), slow NMOS slow PMOS (the "SNSP" in FIG. 4), the slow NMOS typical PMOS (corresponding to SNTP in FIG. 4), the typical NMOS slow PMOS (corresponding to the TNSP in FIG. 4), the typical NMOS typical PMOS (corresponding to TNTP in FIG. 4), the slow NMOS fast PMOS (corresponding to SNFP in FIG. 4), and fast NMOS slow PMOS (corresponding to FNSP in FIG. 4).

Compared with current technologies, the detection result provided by the disclosed process corner detection method can simultaneously satisfy the requirements of the digital and analog integrated circuits and improve the completeness of the process corner detection for a MOS transistor by evaluating separately the performance range of the PMOS transistor and the performance range of the NMOS transistor in a wafer.

Figure 5:
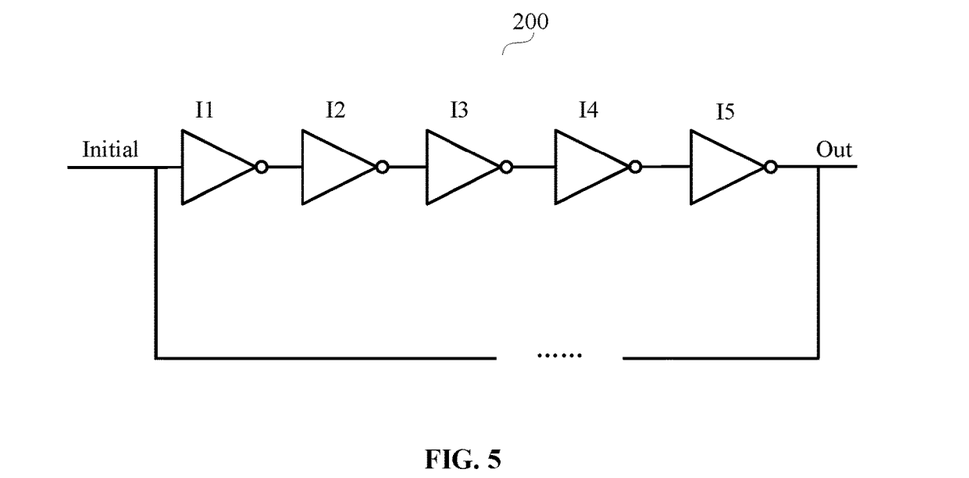
FIG. 5 illustrates an electric circuit diagram of an exemplary ring oscillator consistent with various disclosed embodiments of the present disclosure.

Referring back to S101 in FIG. 3, the exemplary ring oscillator may be provided to include a ring oscillator 200 shown in FIG. 5. The ring oscillator 200 shown in FIG. 5 may include an odd number of oscillation units connected in series, and the output port of one oscillation unit of the odd number of oscillation units serves as the output port of the ring oscillator to output an "Out" oscillation signal. Each oscillation unit is constructed based on a PMOS transistor and an NMOS transistor.

In an embodiment, the oscillation unit may be an inverter, but is not limited thereto. For example, the oscillation unit may also be an NAND gate. The NAND gate may include two NMOS transistors and two PMOS transistors. In one embodiment, the input of the NAND gate can be set at a logic high level such that the NAND gate is functionally equivalent to an inverter. Alternatively, the oscillation unit may include any other appropriate device, circuit, or circuit combination based on PMOS and NMOS transistors.

In an exemplary embodiment, the oscillation unit is an inverter. For simplicity, the example in FIG. 5 only shows a ring oscillator including five inverters I1, I2, I3, I4 and I5, and the output port of the inverter I5 serves as the output port of the ring oscillator.

Figure 6:
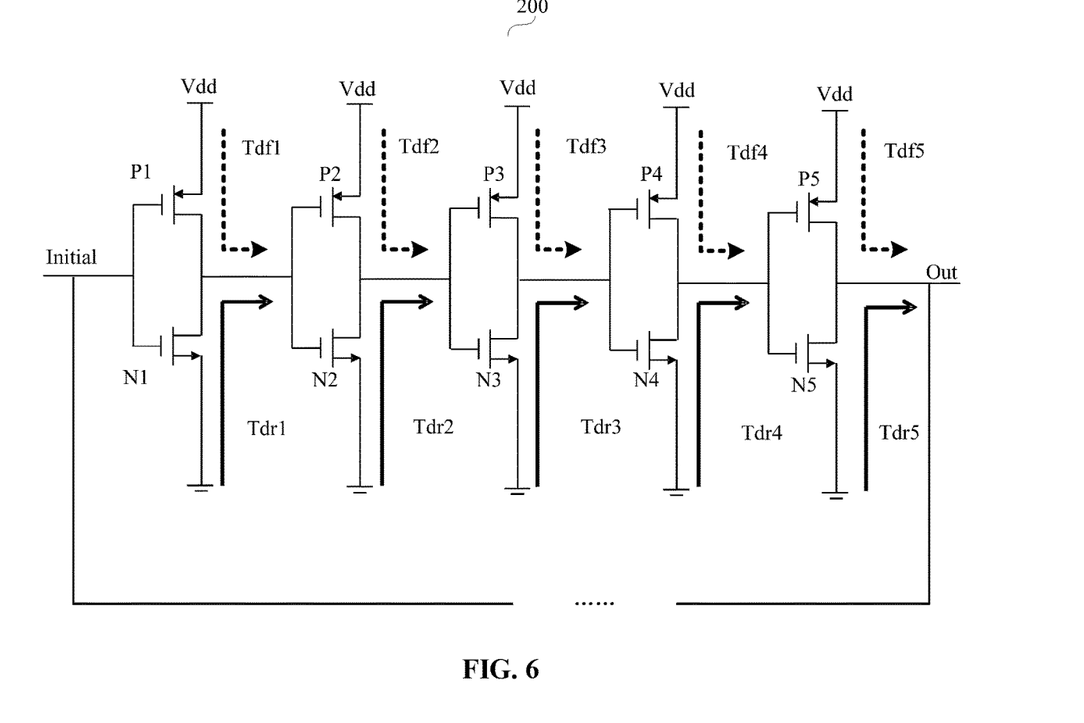
FIG. 6 illustrates an electric circuit diagram of another exemplary ring oscillator consistent with various disclosed embodiments of the present disclosure.

FIG. 6 shows the internal structures of the inverters I1, I2, I3, I4, and I5. For example, the inverter I1 includes a PMOS transistor P1 and an NMOS transistor N1; the inverter I2 includes a PMOS transistor P2 and an NMOS transistor N2; the inverter I3 includes a PMOS transistor P3 and an NMOS transistor N3; the inverter I4 includes a PMOS transistor P4 and an NMOS transistor N4; and the inverter I5 includes a PMOS transistor P5 and an NMOS transistor N5.

In one embodiment, the conduction time of each PMOS transistor in the ring oscillator is the same, and the conduction time of each NMOS transistor in the ring oscillator is also the same. The conduction time of the PMOS transistor and the conduction time of the NMOS transistor may or may not be the same.

Returning to FIG. 3, after providing a ring oscillator, the period of the oscillation signal and the maintaining time of the oscillation signal at a high level and a low level in each cycle are measured (S102), followed by determining the process corner of the PMOS and NMOS transistors in the oscillation unit (S103).

In one embodiment, the process of S103 may include: comparing the period of the "Out" oscillation signal with the first threshold value and the second threshold value to obtain a first comparison result; comparing the maintaining time of the "Out" oscillation signal at a high level and a low level in each cycle to obtain a second comparison result; and determining the process corner of the PMOS and NMOS transistors in the oscillation unit according to the first comparison result and the second comparison result.

Further, the second threshold value is smaller than the first threshold value. The first threshold value and the second threshold value may be preset, and a threshold range may be defined between the first threshold value and the second threshold value. The threshold range may be set according to the typical range of the process corner in a wafer. The threshold range is not limited according to various embodiments of the present disclosure.

The process of determining the process corner of the PMOS and NMOS transistors in an oscillation unit according to the first comparison result and the second comparison result may further include the following.

When the first comparison result indicates that the period of the "Out" oscillation signal is greater than the first threshold value, and the second comparison result indicates that the maintaining time of the "Out" oscillation signal at a high level and at a low level in each cycle is the same, the process corner of the PMOS and NMOS transistors in an oscillation unit is determined to be slow NMOS slow PMOS.

As shown in FIG. 6, if the period of the "Out" oscillation signal is greater than the first threshold value, the overall conduction velocity of the NMOS transistor and the PMOS transistor in the oscillation unit of the ring oscillator 200 is relatively slow, the process corner of the NMOS and PMOS transistors in the oscillation unit will be determined to be one of the process corners: slow NMOS slow PMOS, typical NMOS slow PMOS, and slow NMOS typical PMOS.

Figure 7:
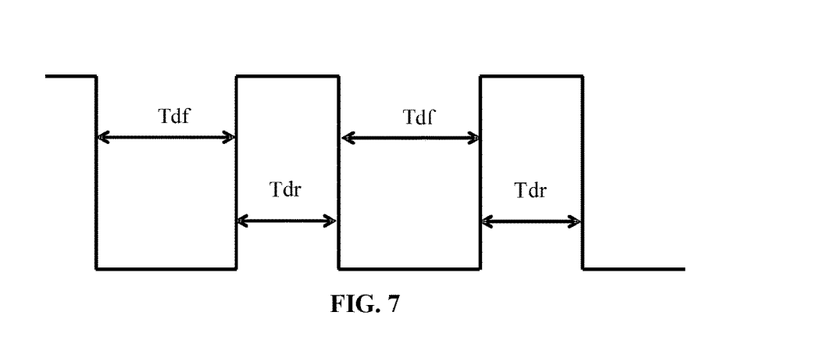
FIG. 7 illustrates a schematic view showing operation waveform of the oscillation signal of the electric circuit shown in FIG. 5 consistent with various disclosed embodiments of the present disclosure.

According to the characteristics of a ring oscillator, each oscillation unit operates twice per oscillation period. At the first time, the signal received at the input port of each oscillation unit is one of the logic high and logic low, and at the second time, the input signal received at each input port of the oscillation unit is the other of the logic high and the logic low, correspondingly. In general, the period of the "Out" oscillation signal is equal to the device delay of a single oscillation unit multiplied by the number of the oscillation units included in a ring oscillator, and then multiplied by 2, which is for the case that each oscillation unit is operated twice in each oscillation cycle with the same device delay. In one embodiment, the device delay may be equal to or different from each other during each oscillation period, that is, the conduction velocity of the NMOS transistor and the conduction velocity of the PMOS transistor in each of the oscillation units may be equal to or different from each other. As shown in FIGS. 6 and 7, the conducting path of each PMOS transistor P1 to P5 is indicated by dashed lines, and their corresponding device delays are denoted as Tdf1, Tdf2, Tdf3, Tdf4, and Tdf5, respectively. The conducting path of each NMOS transistor N1 to N3 is indicated by solid lines, and their corresponding device delays are denoted as Tdr1, Tdr2, Tdr3, Tdr4 and Tdr5, respectively. For example, when each oscillation unit operates for the first time, the PMOS transistor P1, the NMOS transistor N2, the PMOS transistor P3, the NMOS transistor N4, and the PMOS transistor P5 are turned on sequentially, the "Out" oscillation signal will be logic low, and the maintaining time at the logical low level in each cycle is denoted as Tdf; when each oscillation unit operates for a second time, the NMOS transistor N1, the PMOS transistor P2, the NMOS transistor N3, the PMOS tube P4, and the PMOS transistor P4 are turned on sequentially, the "Out" oscillation signal will be set logic high, and the maintaining time at the logic high low level in each cycle is denoted as Tdr.

In this case, the period of the "Out" oscillation signal equals to the sum of the device delay of the NMOS transistor and the device delay of the PMOS transistor in a single oscillation unit multiplied by the number of oscillation units included in the ring oscillator. Further, if the "Out" oscillation signal has a shorter maintaining time at the high level than at the low level in each cycle, the process corner of the PMOS transistor and the NMOS transistor in the oscillation unit is determined to be slow NMOS slow PMOS.

When the period of the "Out" oscillation signal is greater than the first threshold value, if the "Out" oscillation signal has a longer maintaining time at the high level Tdr than the maintaining time Tdf at a low level in each cycle, the process corner of the PMOS transistor and the NMOS transistor in the oscillation unit is determined as typical NMOS slow PMOS; if the "Out" oscillation signal has a shorter maintaining time at a high level Tdr than at a low level Tdf in each cycle, the process corner of the PMOS transistor and the NMOS transistor in the oscillation unit is slow NMOS typical PMOS.

The process corner of the PMOS transistor and the NMOS transistor in an oscillation unit is determined and indicated by the truth table shown in Table 1.

TABLE 1

| TT | SS | FF | NF | PF | EQ | O0 | O1 | O1 | O3 | States |
|---|---|---|---|---|---|---|---|---|---|---|
| 0 | 0 | 1 | 0 | 0 | 1 | 0 | 0 | 0 | 0 | FNFP |
| 0 | 0 | 1 | 0 | 1 | 0 | 0 | 0 | 0 | 1 | TNFP |
| 0 | 0 | 1 | 1 | 0 | 0 | 0 | 0 | 1 | 0 | FNTP |
| 0 | 1 | 0 | 0 | 0 | 1 | 0 | 0 | 1 | 1 | SNSP |
| 0 | 1 | 0 | 0 | 1 | 0 | 0 | 1 | 0 | 0 | SNTP |
| 0 | 1 | 0 | 1 | 0 | 0 | 0 | 1 | 0 | 1 | TNSP |
| 1 | 0 | 0 | 0 | 0 | 1 | 0 | 1 | 1 | 0 | TNTP |
| 1 | 0 | 0 | 0 | 1 | 0 | 0 | 1 | 1 | 1 | SNFP |
| 1 | 0 | 0 | 1 | 0 | 0 | 1 | 0 | 0 | 0 | FNSP |

As shows in Table 1, "SS" denotes that the period of the "Out" oscillation signal is larger than the first threshold value, and the cases that the maintaining time of the "Out" oscillation signal at a high level in each cycle is smaller, larger, and equal to the maintaining time at a low level is represented by PF of 1, NF of 1 and EQ of 1, respectively. Correspondingly, SNSP, TNSP and SNTP denotes that the process corner of the PMOS and NMOS transistors in the oscillation unit is slow SOOS slow PMOS, typical NMOS slow PMOS, and slow NMOS typical PMOS.

Similarly, the process of determining the process corner of the PMOS transistor and the NMOS transistor in an oscillation unit according to the first comparison result and the second comparison result may include the following.

When the period of the "Out" oscillation signal is smaller than the second threshold value, corresponding to the FF in Table 1, that is, the NMOS transistor and the PMOS transistor in the oscillation unit of the ring oscillator 200 exhibit a relatively fast overall conduction velocity, and in each cycle the maintaining time of the "Out" oscillation signal at a high level and a low level is the same, the process corner of the PMOS transistor and the NMOS transistor in the oscillation unit is determined to be fast NMOS fast PMOS, corresponding to the state FNFP in Table 1.

When the period of the "Out" oscillation signal is smaller than the second threshold value and in each cycle the maintaining time of the "Out" oscillation signal at a high level is larger than the maintaining time at a low level, the process corner of the PMOS transistor and the NMOS transistor in the oscillation unit is determined to be typical NMOS fast PMOS, corresponding to the state FNTP in Table 1.

When the period of the "Out" oscillation signal is smaller than the second threshold value and in each cycle the maintaining time of the "Out" oscillation signal at a high level is smaller than the maintaining time at a low level, the process corner of the PMOS transistor and the NMOS transistor in the oscillation unit is determined to be fast NMOS typical PMOS, corresponding to the state TNFP in Table 1.

When the period of the "Out" oscillation signal is larger than the second threshold value but smaller than the first threshold value, that is, the overall conduction velocity of the NMOS and PMOS transistors in the oscillation unit of the ring oscillator 200 is moderate, and in each cycle the maintaining time of the "Out" oscillation signal at a high level is the same with the maintaining time at a low level, the process corner of the PMOS transistor and the NMOS transistor in the oscillation unit is determined to be typical NMOS typical PMOS, corresponding to the state TNTP in Table 1.

When the period of the "Out" oscillation signal is larger than the second threshold value but smaller than the first threshold value, and in each cycle the maintaining time of the "Out" oscillation signal at a high level is larger than the maintaining time at a low level, the process corner of the PMOS transistor and the NMOS transistor in the oscillation unit is determined to be fast NMOS slow PMOS, corresponding to the state FNSP in Table 1.

When the period of the "Out" oscillation signal is larger than the second threshold value but smaller than the first threshold value, and in each cycle the maintaining time of the "Out" oscillation signal at the a level is smaller than the maintaining time at a low level, the process corner of the PMOS transistor and the NMOS transistor in the oscillation unit is determined to be slow NMOS fast PMOS, corresponding to the state SNFP in Table 1.

As shown in Table 1, the disclosed nine exemplary process corners can be denoted by the different values of O0, O1, O2, and O3, respectively. In particular, when O0, O1, O2 and O3 are 0000,0001,0010,0011,0100,0101,0110,0111 and 1000, respectively, the corresponding nine process corners are FNFP, TNFP, FNTP, SNSP, SNTP, TNSP, TNTP, SNFP and FNSP. In a specific embodiment, a detection port may be set corresponding to O0, O1, O2, and O3, and by detecting the level state of the detection port, the process corner of the PMOS transistor and the NMOS transistor in an oscillation unit can be directly obtained.

Figure 8:
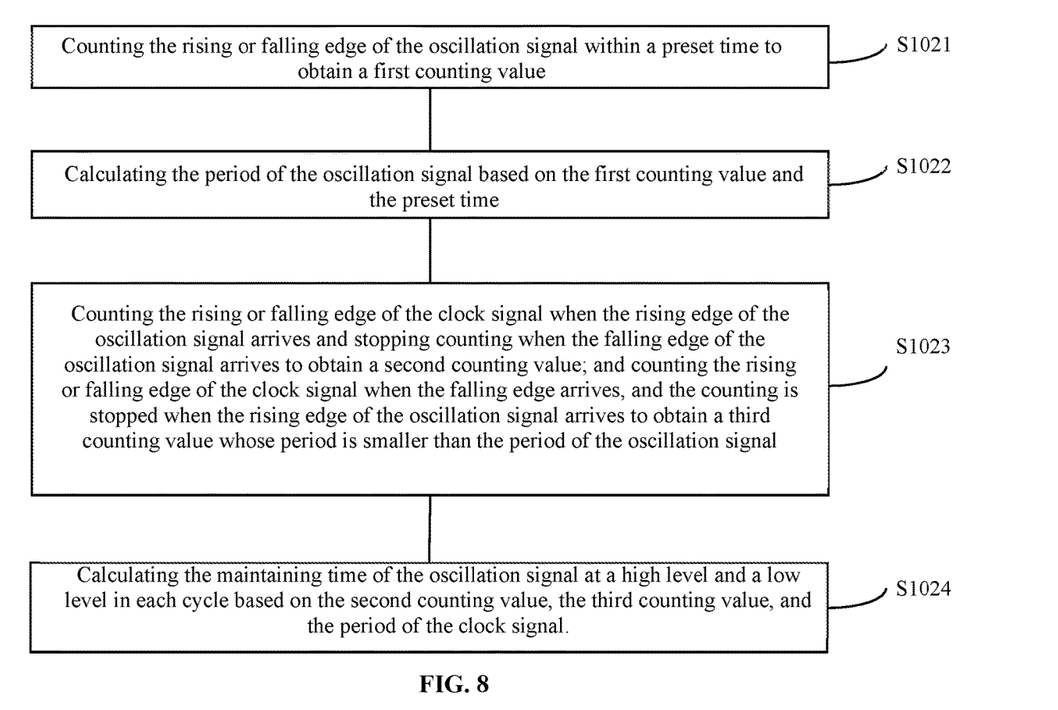
FIG. 8 illustrates a flowchart of an exemplary implementation of process S102 shown in FIG. 3 consistent with various disclosed embodiments of the present disclosure.

As shown in FIG. 8, an exemplary process of measuring the "Out" oscillation signal and the maintaining time the "Out" oscillation signal at a high and a low level in each cycle may include:

counting the rising or falling edge of the "Out" oscillation signal within a preset time to obtain a first counting number (S1021);

calculating the period of the "Out" oscillation signal according to the first counting number and the preset time. When errors are allowed, the first counting number indicates how many periods of the "Out" oscillation signal are obtained within the preset time, and thus, the period of the "Out" oscillation signal is equal to the preset time divided by the first counting number (S1022);

counting the rising or falling edge of the clock signal when the rising edge of the "Out" oscillation signal arrives and stop counting when the falling edge of the "Out" oscillation signal arrives to obtain a second counting number; when the falling edge of the "Out" oscillation signal arrives, the rising or falling edge of the clock signal is counted again and the counting is stopped at the rising edge of the "Out" oscillation signal to obtain a third counting number. The period of the clock signal is smaller than the period of the "Out" oscillation signal (S1023); and calculating the maintaining time of the "Out" oscillation signal at a high and a low level in each cycle based on the second counting number, the third counting number, and the period of the clock signal. When errors are allowed, the maintaining time of the "Out" oscillation signal at a high level in each cycle is equal to the second counting number multiplied by the period of the clock signal, and the maintaining time of the "Out" oscillation signal at a low level in each cycle is equal to the third counting number multiplied by the period of the clock signal (S1024).

In a specific implementation, the counting operation in the process S1023 may be repeatedly performed for a plurality of cycles of the "Out" oscillation signal. Then the product of the second counting number, the third counting number, and the period of the clock signal obtained in a plurality of cycles may be compared to make the second comparison result more reliable as a basis for determining the process corner of the NMOS transistor and the PMOS transistor in an oscillation unit.

In one embodiment, the process S102 may further include dividing the frequency of the "Out" oscillation signal. As a counting process is normally performed when detecting the period of the "Out" oscillation signal and the maintaining time at a high level and a low level in each cycle, the frequency of the clock signal for counting needs to be much higher than the frequency of the "Out" oscillation signal in order to improve the counting precision. The frequency of the "Out" oscillation signal is reduced in advance by dividing the frequency, so that the frequency of the clock signal at the time of detection is reduced correspondingly, which is easy for implementation.

Accordingly, the present disclosure includes a device of detecting a process corner of a MOS transistor formed by the disclosed fabrication method. The detection device includes a ring oscillator, and the ring oscillator includes an odd number of oscillation units connected in series. The output port of one of the oscillation units serves as an output port of the ring oscillator to output an oscillation signal, and each oscillation unit is constructed based on a PMOS transistor and an NMOS transistor. The period and maintaining time of the oscillation signal are measured at a high level and a low level in each cycle; and the process corner of the PMOS transistor and the NMOS transistor in the oscillation unit is determined based on the period of the oscillation signal and the maintaining time of the oscillation signal at the high level and the low level in each cycle.

Compared with current technologies, the detection method in the present disclosure is advantageous.

The process corner detection method of a MOS transistor in the present disclosure includes providing a ring oscillator. The ring oscillator includes an odd number of oscillation units connected in series and an output port of one of the oscillation units serves as the output port of the ring oscillator to output an oscillation signal. Each oscillation unit is constructed based on a PMOS transistor and an NMOS transistor. The process corner detection method further includes measuring the period of the oscillation signal and the maintaining time of the oscillation signal at a high level and a low level in each cycle. Based on the period of the oscillation signal and the maintaining time of the oscillation signal at a high level and a low level in each cycle, the present disclosure can determine the process corner of the PMOS transistor and the NMOS transistor in an oscillation unit to be one of the following nine process corners: fast NMOS fast PMOS, typical NMOS fast PMOS, fast NMOS typical PMOS, slow NMOS slow PMOS, slow NMOS typical PMOS, typical NMOS Slow PMOS, typical NMOS typical PMOS, slow NMOS fast PMOS, and fast NMOS slow PMOS.

The disclosed process corner detection method of the present disclosure can be simultaneously adapted to the analog integrated circuit and the digital integrated circuit, and the completeness of the process corner detection for a MOS transistor is improved.

The above detailed descriptions only illustrate certain embodiments of the disclosed disclosure, and are not intended to limit the scope of the disclosed disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method of detecting a process corner of a MOS transistor, comprising:
   providing a ring oscillator, including an odd number of oscillation units connected in series, wherein an output port of one of the oscillation units serves as an output port of the ring oscillator to output an oscillation signal, and each oscillation unit is constructed based on a PMOS transistor and an NMOS transistor;
   measuring a period of the oscillation signal and a duration time of the oscillation signal at a high level and a low level in each cycle; and
   determining the process corner of the PMOS transistor and the NMOS transistor in the oscillation unit based on the period of the oscillation signal and the duration time of the oscillation signal at the high level and the low level in each cycle, wherein determining the process corner of the PMOS transistor and the NMOS transistor in the oscillation unit comprises:
      comparing the period of the oscillation signal with a first threshold value and a second threshold value to obtain a first comparison result, the second threshold value being less than the first threshold value;
      comparing the duration time of the oscillation signal at the high level and the low level in each cycle to obtain a second comparison result; and
   determining the process corner of the PMOS transistor and the NMOS transistor in the oscillation unit based on the first comparison result and the second comparison result.

2. The method according to claim 1, wherein:
   the process corner of the PMOS transistor and the NMOS transistor in the oscillation unit includes one or more of fast NMOS fast PMOS, standard NMOS fast PMOS, fast NMOS standard PMOS, slow NMOS slow PMOS, slow NMOS standard PMOS, standard NMOS Slow PMOS, standard NMOS standard PMOS, slow NMOS fast PMOS, and fast NMOS slow PMOS.

3. The method according to claim 2, wherein determining the process corner of the PMOS transistor and the NMOS transistor in the oscillation unit based on the first comparison result and the second comparison result comprises:
   determining the process corner of the PMOS transistor and the NMOS transistor in the oscillation unit as slow NMOS slow PMOS, when the period of the oscillation signal is greater than the first threshold value, and the duration time of the oscillation signal at the high level and at the low level in each cycle is the same;
   determining the process corner of the PMOS transistor and the NMOS transistor in the oscillation unit as standard NMOS slow PMOS, when the period of the oscillation signal is greater than the first threshold value, and the duration time of the oscillation signal at the high level is greater than the maintaining time at the low level in each cycle;
   determining the process corner of the PMOS transistor and the NMOS transistor in the oscillation unit as slow NMOS standard PMOS, when the period of the oscillation signal is greater than the first threshold value, and the duration time of the oscillation signal at the high level is smaller than the duration time at the low level in each cycle;

determining the process corner of the PMOS transistor and the NMOS transistor in the oscillation unit as fast NMOS fast PMOS, when the period of the oscillation signal is smaller than the second threshold value, and the duration time of the oscillation signal at the high level and at the low level in each cycle is same;

determining the process corner of the PMOS transistor and the NMOS transistor in the oscillation unit as fast NMOS standard PMOS, when the period of the oscillation signal is smaller than the second threshold value, and the duration time of the oscillation signal at the high level is greater than the duration time at the low level in each cycle;

determining the process corner of the PMOS transistor and the NMOS transistor in the oscillation unit as standard NMOS fast PMOS when the period of the oscillation signal is smaller than the second threshold value and the duration time of the oscillation signal at the high level is smaller than the duration time at the low level in each cycle;

determining the process corner of the PMOS transistor and the NMOS transistor in the oscillation unit as standard NMOS standard PMOS when the period of the oscillation signal is larger than the second threshold value but smaller than the first threshold value, and the maintaining time of the oscillation signal at the high level and at the low level in each cycle is the same;

determining the process corner of the PMOS transistor and the NMOS transistor in the oscillation unit as fast NMOS slow PMOS, when the period of the oscillation signal is larger than the second threshold value and smaller than the first threshold value, and the duration time of the oscillation signal at the high level is larger than the duration time at the low level in each cycle; and determining the process corner of the PMOS transistor and the NMOS transistor in the oscillation unit as slow NMOS fast PMOS, when the period of the oscillation signal is larger than the second threshold value and smaller than the first threshold value, and the duration time of the oscillation signal at the high level is smaller than the duration time at the low level in each cycle.

4. The method according to claim 1, wherein measuring the period of the oscillation signal and the duration time of the oscillation signal at the high level and the low level in each cycle comprises:
dividing a frequency of the oscillation signal.

5. The method according to claim 1, wherein:
each PMOS transistor in the ring oscillator has a same conduction time, and
each NMOS transistor in the ring oscillator has a same conduction time.

6. The method according to claim 1, wherein:
the oscillation unit is an inverter.

7. A method of detecting a process corner of a MOS transistor, comprising:
providing a ring oscillator, including an odd number of oscillation units connected in series, wherein an output port of one of the oscillation units serves as an output port of the ring oscillator to output an oscillation signal, and each oscillation unit is constructed based on a PMOS transistor and an NMOS transistor;

measuring a period of the oscillation signal and a duration time of the oscillation signal at a high level and a low level in each cycle; and determining the process corner of the PMOS transistor and the NMOS transistor in the oscillation unit based on the period of the oscillation signal and the duration time of the oscillation signal at the high level and the low level in each cycle, wherein measuring the period of the oscillation signal and the duration time of the oscillation signal at the high level and the low level in each cycle comprises:
counting a rising or falling edge of the oscillation signal within a preset time to obtain a first counting number;
calculating the period of the oscillation signal based on the first counting number and the preset time;
counting the rising or falling edge of a clock signal when the rising edge of the oscillation signal arrives, and stopping the counting when the falling edge of the oscillation signal arrives, to obtain a second counting number; and counting the rising or falling edge of the clock signal when the falling edge arrives, and stopping the counting when the rising edge of the oscillation signal arrives, to obtain a third counting number, and a period of the clock signal being smaller than the period of the oscillation signal; and
calculating the duration time of the oscillation signal at the high level and the low level in each cycle based on the second counting number, the third counting number, and the period of the clock signal.

8. The method according to claim 7, wherein:
the process corner of the PMOS transistor and the NMOS transistor in the oscillation unit includes one or more of fast NMOS fast PMOS, standard NMOS fast PMOS, fast NMOS standard PMOS, slow NMOS slow PMOS, slow NMOS standard PMOS, standard NMOS Slow PMOS, standard NMOS standard PMOS, slow NMOS fast PMOS, and fast NMOS slow PMOS.

9. The method according to claim 8, wherein determining the process corner of the PMOS transistor and the NMOS transistor in the oscillation unit based on the first comparison result and the second comparison result comprises:
determining the process corner of the PMOS transistor and the NMOS transistor in the oscillation unit as slow NMOS slow PMOS, when the period of the oscillation signal is greater than the first threshold value, and the duration time of the oscillation signal at the high level and at the low level in each cycle is the same;

determining the process corner of the PMOS transistor and the NMOS transistor in the oscillation unit as standard NMOS slow PMOS, when the period of the oscillation signal is greater than the first threshold value, and the duration time of the oscillation signal at the high level is greater than the maintaining time at the low level in each cycle;

determining the process corner of the PMOS transistor and the NMOS transistor in the oscillation unit as slow NMOS standard PMOS, when the period of the oscillation signal is greater than the first threshold value, and the duration time of the oscillation signal at the high level is smaller than the duration time at the low level in each cycle;

determining the process corner of the PMOS transistor and the NMOS transistor in the oscillation unit as fast NMOS fast PMOS, when the period of the oscillation signal is smaller than the second threshold value, and the duration time of the oscillation signal at the high level and at the low level in each cycle is same;

determining the process corner of the PMOS transistor and the NMOS transistor in the oscillation unit as fast NMOS standard PMOS, when the period of the oscillation signal is smaller than the second threshold value, and the duration time of the oscillation signal at the high level is greater than the duration time at the low level in each cycle;

determining the process corner of the PMOS transistor and the NMOS transistor in the oscillation unit as standard NMOS fast PMOS when the period of the oscillation signal is smaller than the second threshold value and the duration time of the oscillation signal at the high level is smaller than the duration time at the low level in each cycle;

determining the process corner of the PMOS transistor and the NMOS transistor in the oscillation unit as standard NMOS standard PMOS when the period of the oscillation signal is larger than the second threshold value but smaller than the first threshold value, and the maintaining time of the oscillation signal at the high level and at the low level in each cycle is the same;

determining the process corner of the PMOS transistor and the NMOS transistor in the oscillation unit as fast NMOS slow PMOS, when the period of the oscillation signal is larger than the second threshold value and smaller than the first threshold value, and the duration time of the oscillation signal at the high level is larger than the duration time at the low level in each cycle; and determining the process corner of the PMOS transistor and the NMOS transistor in the oscillation unit as slow NMOS fast PMOS, when the period of the oscillation signal is larger than the second threshold value and smaller than the first threshold value, and the duration time of the oscillation signal at the high level is smaller than the duration time at the low level in each cycle.

10. The method according to claim 7, wherein measuring the period of the oscillation signal and the duration time of the oscillation signal at the high level and the low level in each cycle comprises:

dividing a frequency of the oscillation signal.

11. The method according to claim 7, wherein:
each PMOS transistor in the ring oscillator has a same conduction time, and
each NMOS transistor in the ring oscillator has a same conduction time.

12. The method according to claim 7, wherein:
the oscillation unit is an inverter.

13. A device of detecting a process corner of a MOS transistor, comprising:
a ring oscillator, including an odd number of oscillation units connected in series, wherein:
an output port of one of the oscillation units serves as an output port of the ring oscillator to output an oscillation signal, and each oscillation unit is constructed based on a PMOS transistor and an NMOS transistor;
a period and a duration time of the oscillation signal are measured at a high level and a low level in each cycle; and
the process corner of the PMOS transistor and the NMOS transistor in the oscillation unit is determined based on the period of the oscillation signal and the duration time of the oscillation signal at the high level and the low level in each cycle, wherein:

the period of the oscillation signal is compared with a first threshold value and a second threshold value to obtain a first comparison result, the second threshold value being less than the first threshold value;

the duration time of the oscillation signal is compared at the high level and the low level in each cycle to obtain a second comparison result; and the process corner of the PMOS transistor and the NMOS transistor in the oscillation unit is determined based on the first comparison result and the second comparison result.

14. The device according to claim 13, wherein:
the process corner of the PMOS transistor and the NMOS transistor in the oscillation unit includes one or more of fast NMOS fast PMOS, standard NMOS fast PMOS, fast NMOS standard PMOS, slow NMOS slow PMOS, slow NMOS standard PMOS, standard NMOS Slow PMOS, standard NMOS standard PMOS, slow NMOS fast PMOS, and fast NMOS slow PMOS.

15. The device according to claim 14, wherein the process corner of the PMOS transistor and the NMOS transistor in the oscillation unit includes:

slow NMOS slow PMOS, when the period of the oscillation signal is greater than the first threshold value, and the duration time of the oscillation signal at the high level and at the low level in each cycle is same;

standard NMOS slow PMOS, when the period of the oscillation signal is greater than the first threshold value, and the duration time of the oscillation signal at the high level is greater than the duration time at the low level in each cycle;

slow NMOS standard PMOS, when the period of the oscillation signal is greater than the first threshold value, and the duration time of the oscillation signal at the high level is smaller than the duration time at the low level in each cycle;

fast NMOS fast PMOS, when the period of the oscillation signal is smaller than the second threshold value, and the duration time of the oscillation signal at the high level and at the low level in each cycle is same;

fast NMOS standard PMOS, when the period of the oscillation signal is smaller than the second threshold value, and the duration time of the oscillation signal at the high level is greater than the duration time at the low level in each cycle;

standard NMOS fast PMOS when the period of the oscillation signal is smaller than the second threshold value and the duration time of the oscillation signal at the high level is smaller than the duration time at the low level in each cycle;

standard NMOS standard PMOS when the period of the oscillation signal is larger than the second threshold value but smaller than the first threshold value, and the duration time of the oscillation signal at the high level and at the low level in each cycle is the same;

fast NMOS slow PMOS, when the period of the oscillation signal is larger than the second threshold value and smaller than the first threshold value, and the duration time of the oscillation signal at the high level is larger than the duration time at the low level in each cycle; and slow NMOS fast PMOS, when the period of the oscillation signal is larger than the second threshold value and smaller than the first threshold value, and the duration time of the oscillation signal at the high level is smaller than the duration time at the low level in each cycle.

16. The device according to claim 13, wherein the period of the oscillation signal and the duration time of the oscillation signal are measured by:
- counting a rising or falling edge of the oscillation signal within a preset time to obtain a first counting number;
- calculating the period of the oscillation signal based on the first counting number and the preset time;
- counting the rising or falling edge of a clock signal when the rising edge of the oscillation signal arrives, and stopping the counting when the falling edge of the oscillation signal arrives, to obtain a second counting number; and counting the rising or falling edge of the clock signal when the falling edge arrives, and stopping the counting when the rising edge of the oscillation signal arrives, to obtain a third counting number, and a period of the clock signal being smaller than the period of the oscillation signal; and
- calculating the duration time of the oscillation signal at the high level and the low level in each cycle based on the second counting number, the third counting number, and the period of the clock signal.

17. The device according to claim 13, wherein the oscillation signal has a divided frequency.

18. The device according to claim 13, wherein:
each PMOS transistor in the ring oscillator has a same conduction time, and
each NMOS transistor in the ring oscillator has a same conduction time.

19. The device according to claim 13, wherein:
the oscillation unit is an inverter.

* * * * *